United States Patent
Yamazaki et al.

(10) Patent No.: US 7,282,398 B2
(45) Date of Patent: Oct. 16, 2007

(54) CRYSTALLINE SEMICONDUCTOR THIN FILM, METHOD OF FABRICATING THE SAME, SEMICONDUCTOR DEVICE AND METHOD OF FABRICATING THE SAME

(75) Inventors: Shunpei Yamazaki, Tokyo (JP); Hisashi Ohtani, Kanagawa (JP); Tamae Takano, Kanagawa (JP)

(73) Assignee: Semiconductor Energy Laboratory Co., Ltd.

( * ) Notice: Subject to any disclaimer, the term of this patent is extended or adjusted under 35 U.S.C. 154(b) by 0 days.

(21) Appl. No.: 09/894,125

(22) Filed: Jun. 29, 2001

(65) Prior Publication Data

US 2001/0036692 A1 Nov. 1, 2001

Related U.S. Application Data

(62) Division of application No. 09/352,198, filed on Jul. 13, 1999, now abandoned.

(30) Foreign Application Priority Data

Jul. 17, 1998 (JP) .................................. 10-203205
May 14, 1999 (JP) .................................. 11-135055

(51) Int. Cl.
*H01L 21/00* (2006.01)
(52) U.S. Cl. ...................... 438/149; 438/151; 438/166; 257/E29.117; 257/E29.273
(58) Field of Classification Search ........ 438/149–166; 257/64, 72, 75, 291, 20, E51.005, E29.151, 257/E29.117, E29.147, E29.273
See application file for complete search history.

(56) References Cited

U.S. PATENT DOCUMENTS 4,986,213 A 1/1991 Yamazaki et al.
5,147,826 A 9/1992 Liu et al.
5,365,875 A 11/1994 Asai et al.

(Continued)

FOREIGN PATENT DOCUMENTS

JP 07038113 A * 2/1995

(Continued)

OTHER PUBLICATIONS

Inventors: Shunpei Yamazaki et al., "Crystalline Semiconductor Thin Film, Method of Fabricating the Same, Semiconductor Device, and Method of Fabricating the Same" Filing Date: Jul. 13, 1999, Specifications and Drawings for U.S. Appl. No. 09/352,362.

(Continued)

*Primary Examiner*—Brook Kebede
(74) *Attorney, Agent, or Firm*—Eric J. Robinson; Robinson Intellectual Property Law Office, P.C.

(57) ABSTRACT

There is provided a technique to form a single crystal semiconductor thin film or a substantially single crystal semiconductor thin film. An amorphous semiconductor thin film is irradiated with ultraviolet light or infrared light, to obtain a crystalline semiconductor thin film (102). Then, the crystalline semiconductor thin film (102) is subjected to a heat treatment at a temperature of 900 to 1200° C. in a reduced atmosphere. The surface of the crystalline semiconductor thin film is extremely flattened through this step, defects in crystal grains and crystal grain boundaries disappear, and the single crystal semiconductor thin film or substantially single crystal semiconductor thin film is obtained.

46 Claims, 9 Drawing Sheets

U.S. PATENT DOCUMENTS

| | | | |
|---|---|---|---|
| 5,403,772 A | 4/1995 | Zhang et al. | |
| 5,426,064 A | 6/1995 | Zhang et al. | |
| 5,461,250 A | 10/1995 | Burghartz et al. | |
| 5,481,121 A * | 1/1996 | Zhang et al. | 257/291 |
| 5,492,843 A | 2/1996 | Adachi et al. | |
| 5,514,879 A * | 5/1996 | Yamazaki | 257/65 |
| 5,529,937 A | 6/1996 | Zhang | |
| 5,563,426 A | 10/1996 | Zhang et al. | |
| 5,569,610 A | 10/1996 | Zhang et al. | |
| 5,578,520 A * | 11/1996 | Zhang et al. | 117/200 |
| 5,594,569 A | 1/1997 | Konuma et al. | |
| 5,604,360 A * | 2/1997 | Zhang et al. | 257/347 |
| 5,605,846 A * | 2/1997 | Ohtani et al. | 148/DIG. 16 |
| 5,608,232 A * | 3/1997 | Yamazaki et al. | 257/66 |
| 5,616,506 A | 4/1997 | Takemura | |
| 5,616,932 A | 4/1997 | Sano et al. | |
| 5,616,935 A | 4/1997 | Koyama et al. | |
| 5,620,910 A * | 4/1997 | Teramoto | 438/151 |
| 5,639,698 A | 6/1997 | Yamazaki et al. | |
| 5,643,826 A | 7/1997 | Ohtani et al. | |
| 5,648,276 A * | 7/1997 | Hara et al. | 438/164 |
| 5,693,541 A * | 12/1997 | Yamazaki et al. | 148/DIG. 16 |
| 5,696,386 A | 12/1997 | Yamazaki | |
| 5,712,191 A | 1/1998 | Nakajima et al. | |
| 5,789,762 A | 8/1998 | Koyama et al. | |
| 5,795,795 A * | 8/1998 | Kousai et al. | 117/106 |
| 5,808,321 A * | 9/1998 | Mitanaga et al. | 257/351 |
| 5,837,619 A | 11/1998 | Adachi et al. | |
| 5,843,833 A * | 12/1998 | Ohtani et al. | 438/486 |
| 5,846,869 A | 12/1998 | Hashimoto et al. | |
| 5,854,096 A | 12/1998 | Ohtani et al. | |
| 5,869,363 A | 2/1999 | Yamazaki et al. | |
| 5,869,387 A | 2/1999 | Sato et al. | |
| 5,879,974 A | 3/1999 | Yamazaki | |
| 5,879,977 A | 3/1999 | Zhang et al. | |
| 5,888,857 A | 3/1999 | Zhang et al. | |
| 5,891,764 A | 4/1999 | Ishihara et al. | |
| 5,897,347 A | 4/1999 | Yamazaki et al. | |
| 5,907,770 A | 5/1999 | Yamazaki et al. | |
| 5,910,015 A | 6/1999 | Sameshima et al. | |
| 5,923,962 A | 7/1999 | Ohtani et al. | |
| 5,923,966 A | 7/1999 | Teramoto et al. | |
| 5,953,597 A | 9/1999 | Kusumoto et al. | |
| 5,956,579 A | 9/1999 | Yamazaki et al. | |
| 5,960,323 A | 9/1999 | Wakita et al. | |
| 5,985,681 A | 11/1999 | Hamajima et al. | |
| 5,985,740 A | 11/1999 | Yamazaki et al. | |
| 5,994,172 A | 11/1999 | Ohtani et al. | |
| 6,023,074 A | 2/2000 | Zhang | |
| 6,027,960 A | 2/2000 | Kusumoto et al. | |
| 6,027,987 A | 2/2000 | Yamazaki et al. | |
| 6,054,739 A | 4/2000 | Yamazaki et al. | |
| 6,071,764 A | 6/2000 | Zhang et al. | |
| 6,071,766 A | 6/2000 | Yamazaki et al. | |
| 6,071,796 A | 6/2000 | Voutsas | |
| 6,077,731 A * | 6/2000 | Yamazaki et al. | 438/150 |
| 6,077,758 A | 6/2000 | Zhang et al. | |
| 6,093,587 A | 7/2000 | Ohtani | |
| 6,093,934 A | 7/2000 | Yamazaki et al. | |
| 6,093,937 A | 7/2000 | Yamazaki et al. | |
| 6,096,581 A | 8/2000 | Zhang et al. | |
| 6,100,562 A | 8/2000 | Yamazaki et al. | |
| 6,121,076 A | 9/2000 | Zhang et al. | |
| 6,124,154 A | 9/2000 | Miyasaka | |
| 6,140,165 A | 10/2000 | Zhang et al. | |
| 6,180,439 B1 | 1/2001 | Yamazaki et al. | |
| 6,197,624 B1 | 3/2001 | Yamazaki | |
| 6,221,738 B1 | 4/2001 | Sakaguchi et al. | |
| 6,285,042 B1 | 9/2001 | Ohtani et al. | |
| 6,335,541 B1 | 1/2002 | Ohtani et al. | |
| 6,365,933 B1 | 4/2002 | Yamazaki et al. | |
| 6,559,036 B1 | 5/2003 | Ohtani et al. | |
| 6,911,698 B2 | 6/2005 | Yamazaki et al. | |
| 7,084,016 B1 | 8/2006 | Yamazaki et al. | |
| 2001/0036692 A1 | 11/2001 | Yamazaki et al. | |
| 2002/0013114 A1 | 1/2002 | Ohtani et al. | |
| 2002/0100937 A1 | 8/2002 | Yamazaki et al. | |
| 2002/0119633 A1 | 8/2002 | Yamazaki et al. | |
| 2003/0094625 A1 | 5/2003 | Yamazaki et al. | |
| 2006/0051907 A1 | 3/2006 | Yamazaki et al. | |

FOREIGN PATENT DOCUMENTS

| | | | |
|---|---|---|---|
| JP | 07-130652 | | 5/1995 |
| JP | 09186336 A | * | 7/1997 |
| JP | 09-312260 | | 12/1997 |
| JP | 10-125927 | | 5/1998 |
| JP | 10-135469 | | 5/1998 |

OTHER PUBLICATIONS

Inventors: Shunpei Yamazaki et al., "Crystalline Semiconductor Thin Film, Method of Fabricating the Same, Semiconductor Device, and Method of Fabricating the Same" Filing Date: Jul. 13, 1999, Specifications and Drawings for U.S. Appl. No. 09/352,373.

Inventors: Ohtani Hisashi et al., "Semiconductor Device and Method of Manufacturing the Same" Filing Date: Jul. 20, 2001, Specifications and Drawings for U.S. Appl. No. 09/908,727.

U.S. Appl. No. 09/412,512, including Specification, Drawings and Pending Claims, "Liquid Crystal Display Active Matrix Type Liquid Crystal Display Device, and Method of Driving the Same", Shunpei Yamazaki, Oct. 5, 1999.

U.S. Appl. No. 09/369,158 "Semiconductor Device and Method of Manufacturing the Same".

U.S. Appl. No. 09/352,194 "Crystalline Semiconductor Thin Film, Method of Fabricating the Same Semiconductor Device, and Method of Fabricating the Same".

Final Office Action dated Dec. 24, 2003 for U.S. Appl. No. 09/908,727 filed Jul. 20, 2001.

R. Shimokawa et al., *Characterization of High-Efficiency Cast-Si Solar Cell Wafers by MBIC Measurement*, Japanese Journal of Applied Physics, vol. 27, No. 5, May. 1988, pp. 751-758.

H. Furue et al., P-78: *Characteristics and Driving Scheme of Polymer-Stabilized Monostable FLCD Exhibiting Fast Response Time and High Contrast Ratio with Gray-Scale Capability*, SID, 1998, pp. 782-785.

T. Yoshida, 33.2: *A Full-Color Thresholdless Antiferroelectric LCD Exhibiting Wide Viewing Angle with Fast Response Time*, SID Digest, 1997; pp. 841-844.

H. Dorin, et al., *Chemistry the Study of Matter*, Prentice Hall, Fourth Edition, 1992, p. 532.

Y. Aya, et al., *Improvement of SPC Poly-Si Film Using the ELA Method*, 1997 International Workshop on Active-Matrix Liquid-Crystal Displays, Sep. 11-12, 1997, pp. 167-170.

H. Abe, et al., *High-Performance Poly-Crystalline Silicon TFTs Fabricated Using the SPC and ELA Methods*, 1998 International Workshop on Active-Matrix Liquid-Crystal Displays, Jul. 9-10, 1998, pp. 85-88.

S. Inul, et al., *Thresholdless Antiferroelectricity in Liquid Crystals and Its Application to Displays*, J. Mater. Chem., 1996, pp. 671-673.

Official Action of Mar. 2, 2005 for U.S. Appl. No. 09/908,727 filed Jul. 20, 2001 to Ohtani.

Official Action of Jul. 11, 2005 for U.S. Appl. No. 09/352,373 filed Jul. 13, 1999 to Yamazaki.

Official Action of Mar. 22, 2005 for U.S. Appl. No. 09/352,362 filed Jul. 13, 1999 to Yamazaki.

* cited by examiner

| OBSERVATION REGION | BEFORE HIGH TEMPERATURE ANNEALING | AFTER HIGH TEMPERATURE ANNEALING |
|---|---|---|
| 1 | 13.623 | 40.925 |
| 2 | 20.027 | 51.126 |
| 3 | 20.629 | 59.364 |
| 4 | 21.798 | 48.539 |
| 5 | 16.666 | 55.341 |
| 6 | 15.097 | 46.510 |
| 7 | 13.120 | 57.655 |
| 8 | 14.035 | 51.120 |
| 9 | 12.599 | 54.416 |
| 10 | 20.699 | 36.945 |
| MINIMUM VALUE (%) | 12.60 | 36.95 |
| MAXIMUM VALUE (%) | 21.80 | 59.36 |
| AVERAGE VALUE (%) | 16.83 | 50.19 |
| STANDARD DEVIATION σ | 3.61 | 7.18 |

Fig. 5 Bearing Ratio (%) at (P-V value)/2

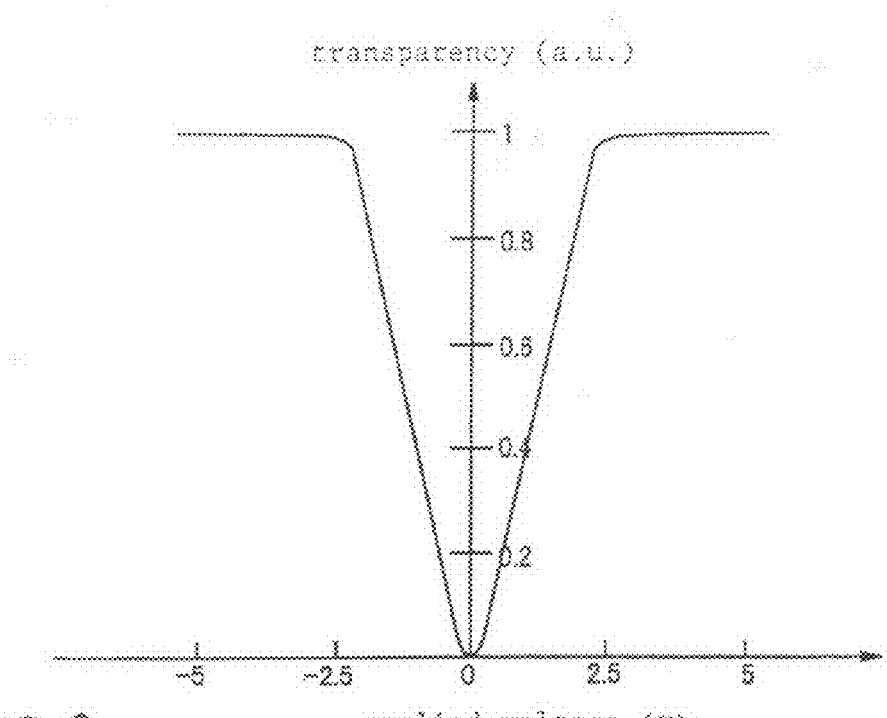
FIG. 6
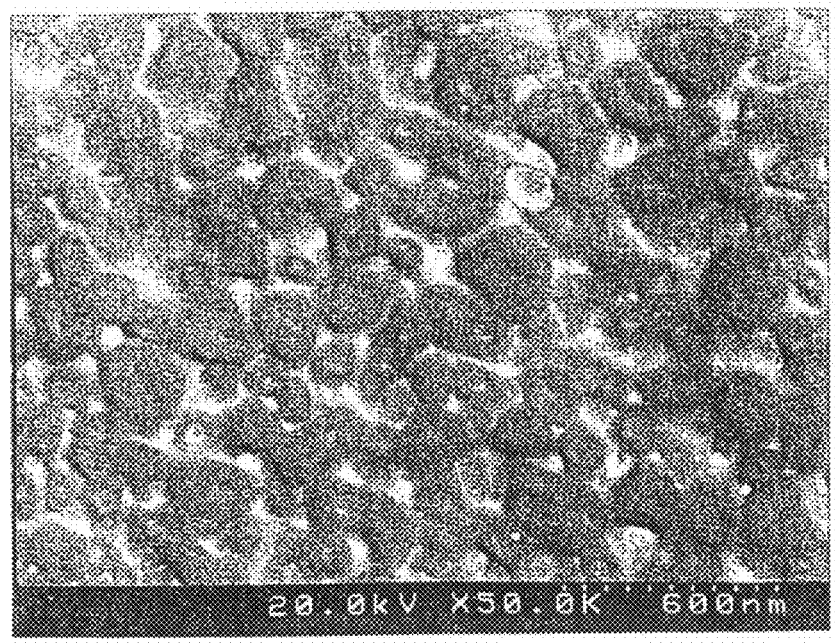
FIG. 7 (Before High Temp. Annealing)

(After High Temp. Annealing)

(Before High Temp. Anneal)

(After High Temp. Annealing)

(Before High Temp. Annealing)

(After High Temperature Annealing)

CRYSTALLINE SEMICONDUCTOR THIN FILM, METHOD OF FABRICATING THE SAME, SEMICONDUCTOR DEVICE AND METHOD OF FABRICATING THE SAME

BACKGROUND OF THE INVENTION

1. Field of the Invention

The present invention relates to a technique on a semiconductor device using a semiconductor thin film, and particularly to a semiconductor device constituted by a thin film transistor (TFT) using a crystalline silicon film and a method of fabricating the same.

Incidentally, in the present specification, the term "semiconductor device" means any devices functioning by using semiconductor characteristics. Thus, the semiconductor device includes not only a single semiconductor component such as a TFT, but also an electrooptical device or semiconductor circuit including TFTs and an electronic equipment having those.

2. Description of Related Art

In recent years, a TFT used for an electrooptical device such as an active matrix type liquid crystal display device has been actively developed.

The active matrix type liquid crystal display device is a monolithic display device in which a pixel matrix circuit and a driver circuit are provided on the same substrate. Moreover, a system-on-panel having a built-in logic circuit such as a γ-correction circuit, a memory circuit, and a clock generating circuit has been also developed.

Since such a driver circuit and a logic circuit are required to perform a high speed operation, it is unsuitable to use a noncrystalline silicon film (amorphous silicon film) as an active layer. Thus, under the present circumstances, a TFT using a crystalline silicon film (single crystal silicon film or polysilicon film) as an active layer has been examined.

The present assignee has Japanese Patent Application Laid-open No. Hei. 7-130652 disclosing a technique for obtaining a crystalline silicon film on a glass substrate. The technique disclosed in the publication is such that a catalytic element for facilitating crystallization is added into an amorphous silicon film, and a heat treatment is carried out to obtain a crystalline silicon film. The entire disclosure of this patent is incorporated herein by reference.

According to this technique, it is possible to greatly lower the crystallization temperature of the amorphous silicon film through the action of the catalytic element by 50 to 100° C., and is also possible to decrease a time required for crystallization down to ⅕ to ¹⁄₁₀.

However, when circuit performance comparable to a conventional LSI comes to be required for a circuit assembled with TFTs, such circumstances have occurred that it is difficult to fabricate a TFT having satisfactory performance to meet the specification by using a crystalline silicon film formed with a conventional technique.

Incidentally, in the present specification, a semiconductor thin film having crystallinity, such as a single crystal semiconductor thin film, a polycrystalline semiconductor thin film, and a microcrystalline semiconductor thin film, is generically referred to as a crystalline semiconductor thin film.

SUMMARY OF THE INVENTION

An object of the present invention is to provide a technique for forming a crystalline semiconductor film to form a semiconductor component having more excellent characteristics.

According to an aspect of the present invention, a method of fabricating a crystalline semiconductor thin film is characterized by comprising the steps of: carrying out a first heat treatment to transform an amorphous semiconductor thin film into a crystalline semiconductor thin film by irradiating an ultraviolet light or infrared light; and carrying out a second heat treatment for the crystalline semiconductor thin film at 900 to 1200° C. in a reduced atmosphere.

In the above structure, the second heat treatment has to be carried out at such a temperature that a natural oxidation film (for example, silicon oxide film) formed on the surface of the crystalline semiconductor thin film can be reduced, and is specifically carried out in a temperature range of 900 to 1200° C. (preferably 1000 to 1100° C.). Besides, it is preferable that a treatment time is at least 3 minutes or more, typically 3 minutes to 2 hours, and representatively 10 minutes to 30 minutes. This is a time required to exhibit effects of the second heat treatment.

Incidentally, the second heat treatment may be carried out after the crystalline semiconductor thin film is converted into island-like portions. Besides, the heat treatment is carried out by furnace annealing (annealing carried out in an electrothermal furnace).

The feature of the present invention is that a crystalline semiconductor thin film is first formed by using a technique of crystallization by irradiating an ultraviolet light or infrared light (hereinafter referred to as laser crystallization), and the crystalline semiconductor thin film is subjected to the heat treatment at 900 to 1200° C. in the reduced atmosphere (typically, hydrogen atmosphere).

In this case, when ultraviolet light is used, it is appropriate that excimer laser light or strong light emitted from an ultraviolet lamp is used as a crystallization technique, and when infrared light is used, it is appropriate that strong light emitted from an ultraviolet laser or an infrared lamp is used.

As the excimer laser light, it is appropriate that KrF, XeCl, ArF or the like is used for an excitation gas. Further, as the infrared light, Nd: YAG laser, Nd: glass laser, ruby laser or the like may be used.

The beam of the laser light may be formed to have a linear or planar cross section. When the beam is a line-shaped beam, such a laser that scans a laser light from one end of the substrate toward the other end thereof is preferably used.

Further, when the beam is a planar beam, the area of about several tens $cm^2$ (preferably, 10 $cm^2$ or more) can be irradiated at one time, and it is appropriate that a laser having a total output energy of 5 J or more, preferably 10 J or more, is used. In this case, it is preferable that the density of energy is 100 to 800 $mJ/cm^2$, and the output pulse width is 100 nsec or more, preferably 200 nsec to 1 msec. For the purpose of realizing the pulse width of 200 nsec to 1 msec, it is appropriate that a plurality of lasers are connected to one another and synchronization of the lasers are shifted to create a state where plural pulses are mixed.

Incidentally, high temperature annealing in a reduced atmosphere which is carried out for the crystalline semiconductor thin film that has been crystallized has an effect to flatten the surface of the crystalline semiconductor thin film. This is a result of enhanced surface diffusion of semiconductor atoms to make the surface energy minimum.

The effect of flattening is very effective in the case where the crystalline film is irradiated with excimer laser ultraviolet light. When irradiation of excimer laser is done, the semiconductor film is instantaneously melted from its surface, and then, the melted semiconductor film is cooled and solidified from a substrate side by heat conduction to the substrate. In this solidifying step, the melted semiconductor film is recrystallized, and becomes a crystalline semiconductor thin film with a large grain diameter. However, since the film is once melted, volume expansion occurs so that asperities (ridges) are produced on the surface of the semiconductor film. In the case of a top gate type TFT, since the surface having the asperities becomes an interface to a gate insulating film, the component characteristics are greatly affected.

BRIEF DESCRIPTION OF THE DRAWINGS

In the accompanying drawings:

FIG. 5 shows statistical data of bearing ratios at ½ of P-V;

FIG. 6 is a characteristic view of a thresholdless antiferroelectric mixed liquid crystal;

FIG. 7 is a SEM observation photograph of the surface of a crystalline silicon film before high temperature annealing;

DETAILED DESCRIPTION OF THE PREFERRED EMBODIMENTS

Figure 1A:
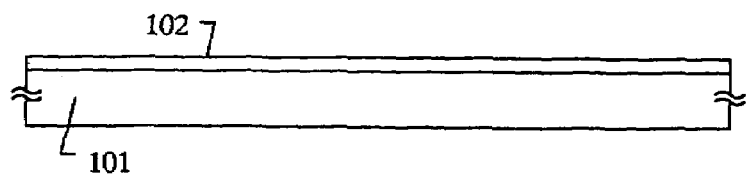
FIGS. 1A to 1F are views showing fabricating steps of a thin film transistor.

First, by using experimental results obtained by the present inventor, an effect of high temperature annealing of the present invention will be described.

An experimental procedure will first be explained. An amorphous silicon film with a thickness of 50 nm was formed on a quartz substrate. A low pressure CVD method was used for film formation, and disilane ($Si_2H_6$) (flow rate: 250 sccm) and helium (He) (flow rate: 300 sccm) were used as film forming gases. The temperature of the substrate was made 465° C. and the pressure at film formation was made 0.5 torr.

The surface of the amorphous silicon film was etched by buffered hydrofluoric acid to remove a natural oxidation film and pollution. Next, the amorphous silicon film was irradiated with XeCl excimer laser light to be crystallized. An atmosphere of the laser irradiation was the air, and the substrate temperature was room temperature, the density of laser energy was 400 mJ/cm$^2$, and the pulse width of the laser light was 150 nsec.

Then the crystalline silicon film was subjected to a high temperature annealing treatment. The condition of the high temperature annealing treatment was made as follows: An atmosphere was made hydrogen of 100%, the degree of vacuum was 700 torr, annealing temperature was 1000° C., and an annealing time was 25 minutes. Incidentally, before the high temperature annealing treatment, the crystalline silicon film was subjected to a wet etching treatment by hydrofluoric acid, so that a natural oxidation film and pollution on the surface were removed.

Figure 8:
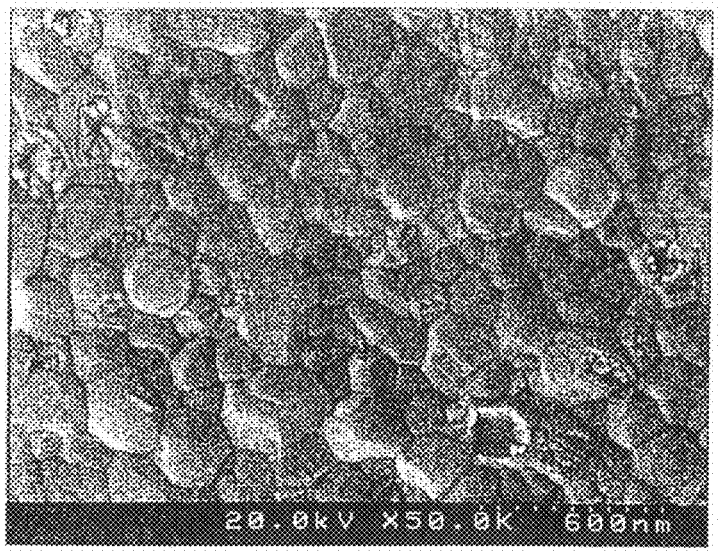
FIG. 8 is a SEM observation photograph of the surface of the crystalline silicon film after high temperature annealing.

For the purpose of ascertaining the effect of the high temperature annealing, the surface of the crystalline silicon film before and after the high temperature annealing was observed by SEM. FIG. 7 shows an observation photograph before the high temperature annealing, and FIG. 8 shows an observation photograph after the high temperature annealing. As is apparent from FIGS. 7 and 8, the surface shapes are clearly different before and after the high temperature annealing.

Figure 9:
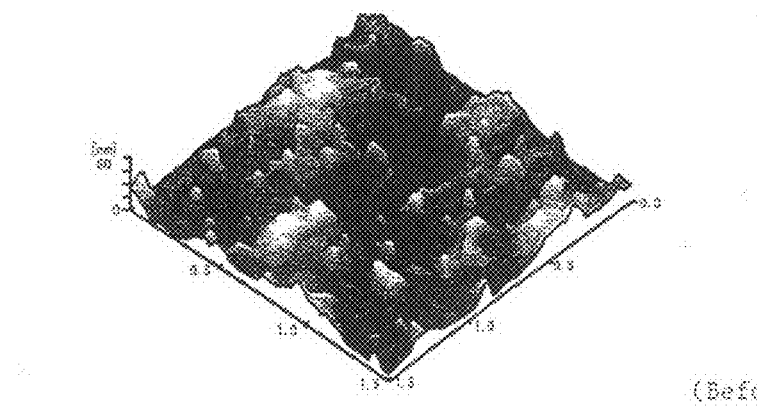
FIG. 9 is an AFM image of the surface of a crystalline silicon film before high temperature annealing.
Figure 10:
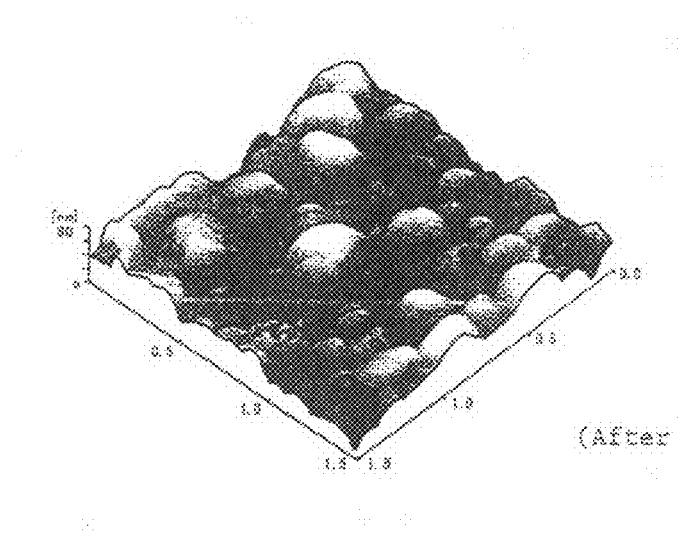
FIG. 10 is a AFM image of the surface of the crystalline silicon film after high temperature annealing.

Further, the surface shape of the silicon film was also observed by an AFM (Atomic Force Microscope). FIG. 9 shows an observation image of the crystalline silicon film by the AFM before the high temperature annealing, and FIG. 10 shows an observation image of the crystalline silicon film by the AFM after the high temperature annealing. Incidentally, the range of observation is a rectangular region of 1.5 μm×1.5 μm in both FIGS. 9 and 10.

As is apparent from FIGS. 9 and 10, the surface shapes of the crystalline silicon film before and after the high temperature annealing are clearly different. Although asperities exist on the surface of the crystalline silicon film before and after the high temperature annealing, before the high temperature annealing, a protrusion is steep, and its top portion is sharp, and the surface totally shows a serrate shape. When the surface having such protrusions becomes an interface between a gate insulating film and a channel formation region, it is thinkable that the component characteristics suffer a very bad influence. On the contrary, a protrusion after the high temperature annealing is smooth, and its top portion is round, so that the characteristics of the interface between the gate insulating film and the channel formation region are improved as compared with those before the high temperature annealing.

Although it is understood that the surface of the crystalline silicon film is flattened and smoothed even from the observation images shown in FIGS. 7 to 10, a histogram distribution of heights of AFM images was calculated so as to further quantify the difference of the surface shapes before and after the high temperature annealing. Further, a bearing ratio curve of the histogram distribution was calculated. The bearing ratio curve is a curve expressing a cumulative frequency of the histogram distribution.

Figure 11:
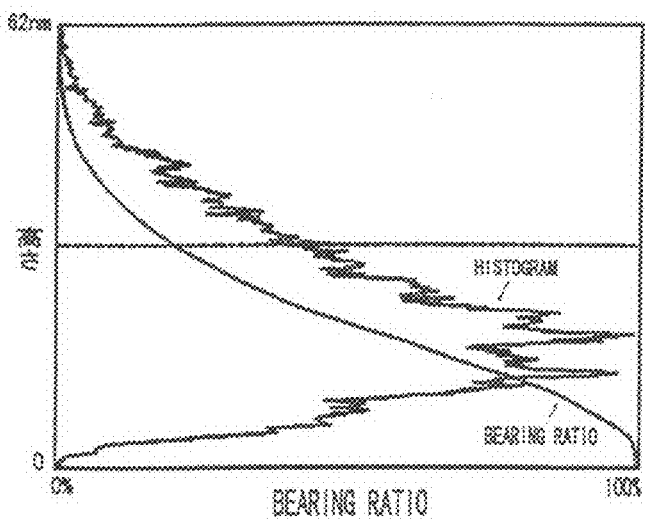
FIG. 11 is a histogram distribution and a bearing ratio curve of the height of an AFM image before high temperature annealing.
Figure 12:
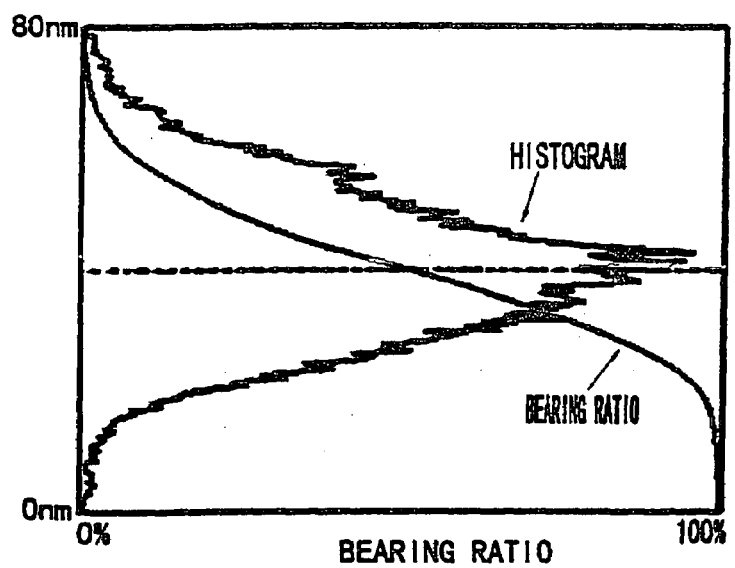
FIG. 12 is a histogram distribution and a bearing ratio curve of the height of the AFM image after high temperature annealing.

FIGS. 11 and 12 show the histogram of the heights of the AFM images and the bearing ratio curve. FIG. 11 shows data before the high temperature annealing, and a pitch of the histogram is about 0.16 nm. FIG. 12 shows data after the high temperature annealing, and a pitch of the histogram is about 0.20 nm.

The measurement region by the AFM is 1.5 μm×1.5 μm. The bearing ratio curve is a curve expressing the cumulative frequency of data of the histogram. The curves of FIGS. 11 and 12 are obtained through accumulation from the maximum value of the height, and expresses an occupation ratio (%) of areas with height from the maximum value to an arbitrary value to the total area. In FIGS. 11 and 12, the horizontal line shown by a dotted line in the graph indicates the value of ½ of the P-V value (Peak to Valley, difference between the maximum value and the minimum value in height).

Further, in the silicon film before and after the high temperature annealing, the AFM images were observed in ten regions (rectangle region of 1.5 µm×1.5 µm), and the beaming ratios at $2^{-1}$(P-V value) in the respective observation regions were calculated. FIG. 5 shows the bearing ratios in the respective observation regions and their statistical data.

When the curves in FIGS. 11 and 12 are compared with each other, although the height distribution before the high temperature annealing is inclined toward a low portion side, the inclination is shifted toward a high portion side after the high temperature annealing, and the histogram is symmetrical with respect to the position of ½ of the P-V. This can be easily understood from the bearing ratio curve.

The bearing ratio at the height of $2^{-1}$(P-V) is about 20% in FIG. 11, and about 51% in FIG. 12. That is, an occupation ratio of an area of a region where the height is within the range from the maximum value to $2^{-1}$(P-V value) to the total area is about 20% before the high temperature annealing, and about 51% after the high temperature annealing. From the difference in this ratio as well, it can be understood that the sharp top portion has been rounded and the surface of the silicon film has been flattened by the high temperature annealing.

In the present invention, the surface shape of the crystalline silicon film is quantified by the bearing ratio at $2^{-1}$(P-V value), and from experimental results, it is presumed that the bearing ratio at $2^{-1}$(P-V value), that is, in a predetermined observation region, an occupation ratio of a region where the height exists in the range from the maximum value to $2^{-1}$(P-V value) is within the range of 6 to 28% in the film before the high temperature annealing, and 29 to 72% in the film after the high temperature annealing.

Incidentally, the range of the bearing ratio is set from the statistical data of FIG. 5, and is a value calculated from an average value $\pm 3\sigma$ of the bearing ratio at $2^{-1}$(P-V value). The bearing ratio is a value accumulated from the maximum value of the height.

As described above, since the crystalline semiconductor thin film crystallized by ultraviolet light such as excimer laser light is crystallized after the surface has been melted, the occupying ratio of a region where the height is within the range from the maximum value to ½ of the difference between the maximum value and the minimum value is 6 to 28% to a predetermined region. In the present invention, since this crystalline semiconductor thin film is subjected to the high temperature annealing, the occupation ratio of this region is changed to 29 to 72%, and the top portion of the protrusion of the film surface can be made smooth.

This step has also an effect to greatly decrease defects existing in crystal grains and crystal grain boundaries. This effect is obtained through a terminating effect of uncombined bonds by hydrogen, a removing effect of impurities by hydrogen, and recombination of semiconductor atoms with the effect. Thus, for the purpose of causing these effects to be effectively exhibited, the treatment time as set forth above becomes necessary.

Thus, it is necessary to carry out the heat treatment step in the reduced atmosphere by furnace annealing. If the heat treatment is carried out by irradiation of ultraviolet light or infrared light, recrystallization progresses in a nonequilibrium state so that continuity of crystal lattices at crystal grain boundaries is damaged, which is not preferable. In this point, in the furnace annealing, since recrystallization progresses in an equilibrium state, such a problem can be avoided.

According to another aspect of the present invention, the method of the present invention is characterized by comprising the steps of:

forming an amorphous semiconductor thin film on a substrate having an insulating surface;

carrying out a first heat treatment to transform the amorphous semiconductor thin film into a crystalline semiconductor thin film by irradiating ultraviolet light or infrared light;

carrying out a second heat treatment for the crystalline semiconductor thin film in a reduced atmosphere including a halogen element; and prior to the step of forming the amorphous semiconductor thin film, adding a catalytic element for facilitating crystallization of the amorphous semiconductor thin film to the substrate having the insulating surface.

In such an arrangement, the second heat treatment is carried out at a temperature range of 900 to 1200° C. This step aims at a gettering function of the halogen element to a metal element, and has an object to remove as halogen compound the metal element existing in a crystalline semiconductor thin film.

In the following, preferred embodiments of the present invention will be described in detail.

Embodiment 1

In this embodiment, the steps of fabricating a TFT on a substrate in accordance with the present invention will be described, A description will be made with reference to FIG. 1.

First, a quartz substrate was prepared as a substrate 101. A material having high heat resistance must be selected as the substrate 101. Instead of the quartz substrate, a substrate of a material having high heat resistance, such as a silicon substrate, a ceramic substrate, or a crystallized glass substrate, may be used.

However, although an under film may not be provided in the case where the quartz substrate is used, it is preferable to provide an insulating film as the under film in the case where other materials are used. As an insulating film, it is appropriate that either one of a silicon oxide film (SiOx), a silicon nitride film (SixNy), a silicon nitride oxide film (SiOxNy), and an aluminum nitride film (AlxNy), or a laminate film of those is used.

Besides, it is effective to use an under film laminate a refractory metal layer and a silicon oxide film since a heat radiation effect is greatly increased. Even the laminate structure of the foregoing aluminum nitride film and the silicon oxide film exhibits a sufficient heat radiation effect.

After the substrate 101 having the insulating surface was prepared in this way, a crystalline silicon film with a thickness of 30 nm was formed by using a crystallization technique using a excimer laser. Only the outline will be described in the present embodiment.

For the purpose of forming an amorphous silicon film, in this embodiment, disilane ($Si_2H_6$) was used as a film forming gas. An amorphous silicon film (not shown) with a thickness of 20 to 60 nm was formed by a low pressure CVD method. At this time, it is important to thoroughly control the concentration of impurities, such as C (carbon), N (nitrogen), and O (oxygen) mixed in the film. This is because if the amount of these impurities is high, the progress of crystallization is prevented.

The applicant controlled the impurity concentration so that the concentration of carbon and nitrogen became $5 \times 10^{18}$ atoms/cm³ or less (preferably $1 \times 10^{18}$ atoms/cm³ or less, more preferably, $5 \times 10^{17}$ atoms/cm³ or less, further more preferably $2\times10^{17}$ toms/cm$^3$), the concentration of oxygen became $1.5\times10^{19}$ atoms/cm$^3$ or less (preferably $5\times10^{18}$ atoms/cm$^3$ or less, more preferably $1\times10^{18}$ atoms/cm$^3$). Further, control was made so that the concentration of metal elements became $1\times10^{17}$ atoms/cm$^3$ or less. When such control of concentration has been made at a film formation stage, if only external pollution is prevented, impurity concentration is not increased during the steps of fabricating a TFT.

After the amorphous silicon film was formed, dehydrogenation was carried out for about one hour at 450° C., and thereafter the step of crystallizing the amorphous silicon film was carried out using XeCl excimer laser light excited by the X-ray (second heat treatment). In this embodiment, the area of the laser irradiation was 10 cm×10 cm, the density of laser energy was 300 mJ/cm$^2$, and the pulse width of the laser light was 150 nsec. A crystalline silicon film 102 was thus obtained (FIG. 1A).

Incidentally, if film quality equal to the amorphous silicon film formed by the reduced pressure CVD method may be obtained, a plasma CVD method may be used. Instead of the amorphous silicon film, an amorphous semiconductor thin film such as a film of silicon germanium (expressed by $Si_xGe_{1-x}$ (0<X<1)) in which germanium is contained in an amorphous silicon film may be used. In that case, it is desirable that germanium contained in silicon germanium is made 5 atomic % or less.

Figure 1B:
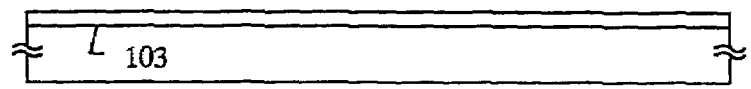
Figure 1C:
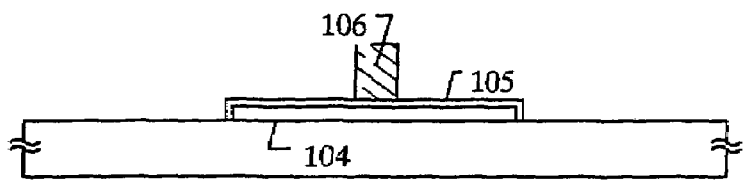
Figure 1D:
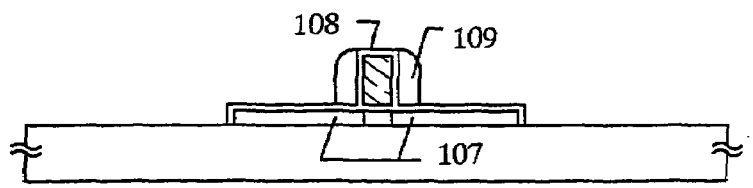

Next, a heat treatment within a temperature range of 900 to 1200° C. (preferably 1000 to 1150° C.) was carried out in a reduced atmosphere. In this embodiment, a heat treatment at 1050° C. for 20 minutes was carried out in a hydrogen atmosphere (FIG. 1C). As a result, the occupying ratio of a region where the height is within the range from the maximum value to ½ of the difference between the maximum value and the minimum value can be 29 to 72% (FIG. 1B).

As the reduced atmosphere, although a hydrogen atmosphere, an ammonia atmosphere, or an inert gas atmosphere containing hydrogen or ammonia (mixture atmosphere of hydrogen and nitrogen or hydrogen and argon) is desirable, flattening of the surface of the crystalline silicon film can be made by even the inert gas atmosphere. However, if reduction of a natural oxidation film is carried out by using a reducing function, a number of silicon atoms with high energy are produced and the flattening effect is consequently raised, so that the reduced atmosphere is preferable.

However, attention must be paid especially to a point that the concentration of oxygen or oxygen compound (for example, OH group) contained in the atmosphere is made 10 ppm or less (preferably 1 ppm or less). Otherwise, the reducing reaction by hydrogen may not occur sufficiently.

In this way, a crystalline silicon film 103 was obtained. The surface of the crystalline silicon film 103 was greatly flattened by a hydrogen heat treatment at a high temperature such as 900 to 1200° C. Besides, since the heat treatment was carried out at a high temperature, lamination defects and the like hardly existed in the crystal grains.

After the crystalline silicon film 103 was obtained in this way, the crystalline silicon film 103 was next patterned to form an active layer 104. In this embodiment, although the heat treatment in the hydrogen atmosphere is carried out before the active layer 111 is formed, the heat treatment may be carried out after the active layer is formed. In the case, it is preferable that since patterning has been made, stress generated in the crystalline silicon film is relieved.

Then a thermal oxidation step was carried out so that a silicon oxide film 105 with a thickness of 10 nm was formed on the surface of the active layer 104. This silicon oxide film 105 functions as a gate insulating film. Besides, since the film thickness of the active layer 104 was decreased by 5 nm, the film thickness became 30 nm. In view of the film decrease by the thermal oxidation, it is necessary to determine the film thickness of the amorphous silicon film (starting film) so that an active layer 111 (especially a channel formation region) with a thickness of 5 to 40 nm finally remains.

After the gate insulating film 105 was formed, a polycrystalline silicon film having conductivity was formed thereon and a gate wiring line 106 was formed by patterning (FIG. 1C).

In this embodiment, although the polycrystalline silicon film having N-type conductivity is used as the gate wiring line, a material is not limited to this. Particularly, for the purpose of lowering the resistance of the gate wiring line, it is also effective to use tantalum, tantalum alloy, or laminate film of tantalum and tantalum nitride. Further, in order to attain a gate wiring line with low resistance, it is also effective to use copper or copper alloy.

After the state of FIG. 1C was obtained, an impurity to give N-type conductivity or P-type conductivity was added to form an impurity region 107. The impurity concentration at this time was determined in view of an impurity concentration of a subsequent LDD region. In this embodiment, although arsenic with a concentration in $1\times10^{18}$ atoms/cm$^3$ was added, it is not necessary to limit the impurity and the concentration to those of this embodiment.

Next, a thin silicon oxide film 108 with a thickness of about 5 to 10 nm was formed on the surface of the gate wiring line 106. It is appropriate that this film is formed by using a thermal oxidation method or a plasma oxidation method. The formation of this silicon oxide film 108 has an object to cause the film to function as an etching stopper in a subsequent side wall forming step.

After the silicon oxide film 108 that functions as an etching stopper was formed, a silicon nitride film was formed and etch back was carried out, so that a side wall 109 was formed. In this way, the state of FIG. 1D was obtained.

Incidentally, in this embodiment, although the silicon nitride film was used as the side wall, it is also possible to use a polycrystalline silicon film or an amorphous silicon film. Of course, it is needless to say that if a material of the gate wiring line is changed, a material which can be used as the side wall is also changed according to that.

Figure 1E:
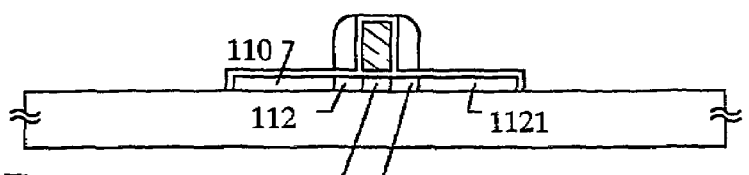

Next, an impurity with the same conductivity as that in the previous step was again added. The concentration of the impurity added at this time was made higher than that in the previous step. In this embodiment, although arsenic is used as an impurity and its concentration is made $1\times10^{21}$ atoms/cm$^3$, it is not necessary to make limitation to this. By the adding step of the impurity, a source region 110, a drain region 111, an LDD region 112, and a channel formation region 113 were defined (FIG. 1E).

After the respective impurity regions were formed in this way, activation of the impurity was carried out by a heat treatment such as furnace annealing, laser annealing, or lamp annealing.

Figure 1F:
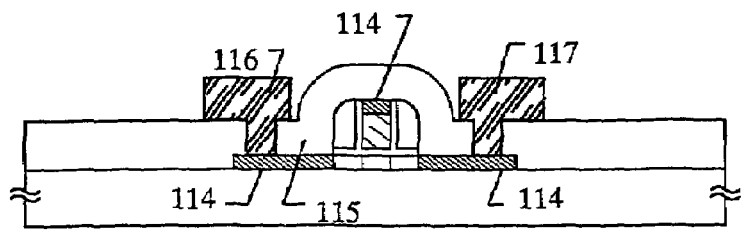

Next, silicon oxide films formed on the surfaces of the gate wiring line 106, the source region 110, and the drain region 111 were removed to expose the surfaces of those. Then a cobalt film (not shown) with a thickness of about 5 nm was formed and a heat treatment step was carried out. A reaction of cobalt and silicon occurred by this heat treatment, so that a silicide layer (cobalt silicide layer) 114 was formed (FIG. 1F).

This technique is a well-known salicide technique. Thus, instead of cobalt, titanium or tungsten may be used, and a heat treatment condition and the like may be determined by referring to a well-known technique. In this embodiment, the heat treatment step was carried out by irradiation of infrared light.

After the silicide layer 114 was formed in this way, the cobalt film was removed. Thereafter, an interlayer insulating film 115 with a thickness of 1 μm was formed. As the interlayer insulating film 115, it is appropriate that a silicon oxide film, a silicon nitride film, a silicon nitride oxide film, or a resin film (polyimide, acryl, polyamide, polyimidoamide, benzocyclobutene (BCB), etc.) is used. These insulating films may be laminated in a free combination.

Next, contact holes were formed in the interlayer insulating film 115, and a source wiring line 116 and a drain wiring line 117 made of a material containing aluminum as its main ingredient were formed. Finally, the whole component was subjected to furnace annealing at 300° C. for 2 hours in a hydrogen atmosphere, so that hydrogenating was completed.

A TFT as shown in FIG. 1F was obtained in this way. Incidentally, the structure explained in this embodiment is merely an example, and a TFT structure to which the present invention can be applied is not limited to this. The present invention can be applied to a TFT of any well-known structure. Besides, it is not necessary to limit numerical value conditions in steps subsequent to formation of the crystalline silicon film 103 to those of this embodiment. Further, there is no problem if a well-known channel doping step (impurity adding step for controlling a threshold voltage) is introduced to somewhere in this embodiment.

Besides, in this embodiment, since the concentration of impurities such as C, N, and O was thoroughly controlled at the stage of film formation of the amorphous silicon film as the starting film, the concentration of each impurity contained in the active layer of the completed TFT was such that the concentration of carbon and nitrogen remained to be $5 \times 10^{18}$ atoms/cm$^3$ or less (preferably $1 \times 10^{18}$ atoms/cm$^3$ or less, more preferably $5 \times 10^{17}$/cm$^3$ or less, further more preferably $2 \times 10^{17}$ cm$^{-3}$ or less), and the concentration of oxygen remained to be $1.5 \times 10^{19}$ atoms/cm$^3$ or less (preferably $5 \times 10^{18}$ atoms/cm$^3$ or less, more preferably $1 \times 10^{18}$ cm$^{-3}$ or less). The concentration of metal elements was $1 \times 10^{17}$ atoms/cm$^3$ or less.

Besides, the present invention can be applied to not only a top gate structure but also to a bottom gate structure typified by a reverse stagger TFT.

Although the description has been made on the N-channel TFT as an example, it is also easy to fabricate a P-channel TFT through combination with a well-known technique. Further, through combination with a well-known technique, it is also possible to form a CMOS circuit by fabricating an N-channel TFT and a P-channel TFT on the same substrate and by complementarily combining them.

Further, in the structure of FIG. 1F, if a pixel electrode (not shown) electrically connected to the drain wiring line 117 is formed by a well-known means, it is also easy to form a pixel switching element of an active matrix type display device. U.S. Pat. No. 5,712,495 issued to Suzawa is an example for showing a structure of an active matrix device. An entire disclosure of this patent is incorporated herein by reference. It is also preferable to use an LDD TFT as a switching transistor for a pixel.

The present invention can be also carried out when an active matrix type electrooptical device such as a liquid crystal display device or an EL (electroluminescence) display device is fabricated.

Embodiment 2

In this embodiment, the case will be described where the step of removing a metal element in the film is used together with the step of hydrogen annealing at 900-1200° C. according to the embodiment 1.

In this embodiment, a heat treatment was carried out at 900 to 1200° C. in the atmosphere where 0.1 to 5 wt % of hydrogen halide (typically, hydrogen chloride) is combined in the hydrogen atmosphere. Besides, NF$_3$ or HBr may be used as hydrogen halide.

By adopting this embodiment, it is possible to remove or lower a metal element from the crystalline silicon film. Since the concentration of the metal element is lowered down to $1 \times 10^{17}$ atoms/cm$^3$ or less, it is possible to prevent TFT characteristics (especially off current value) from fluctuating by the existence of the metal element.

Embodiment 3

Figure 2A:
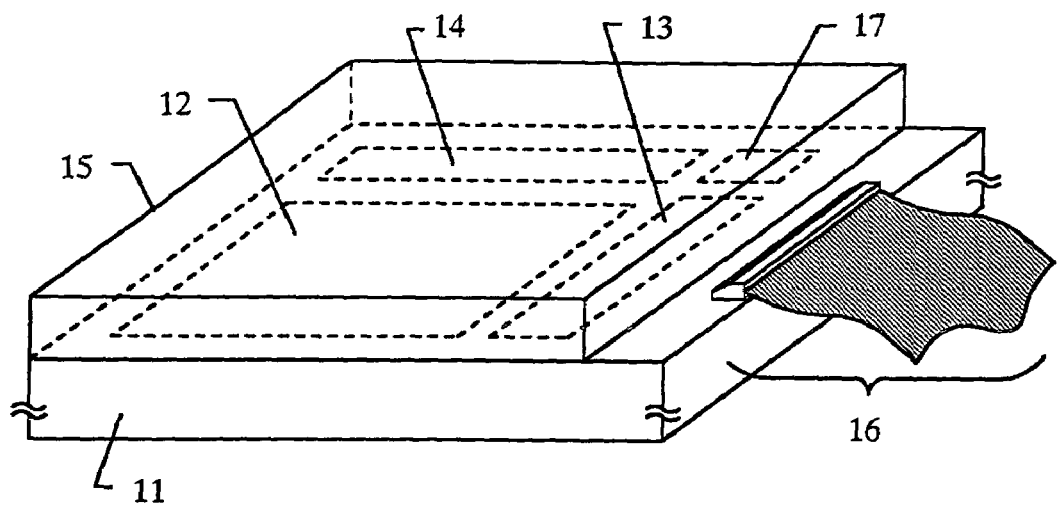
FIGS. 2A to 2C are views showing the structures of electrooptical devices.
Figure 2B:
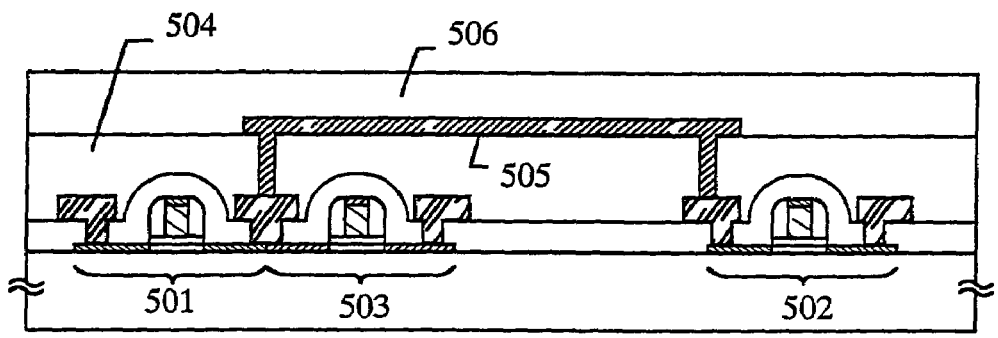
Figure 2C:
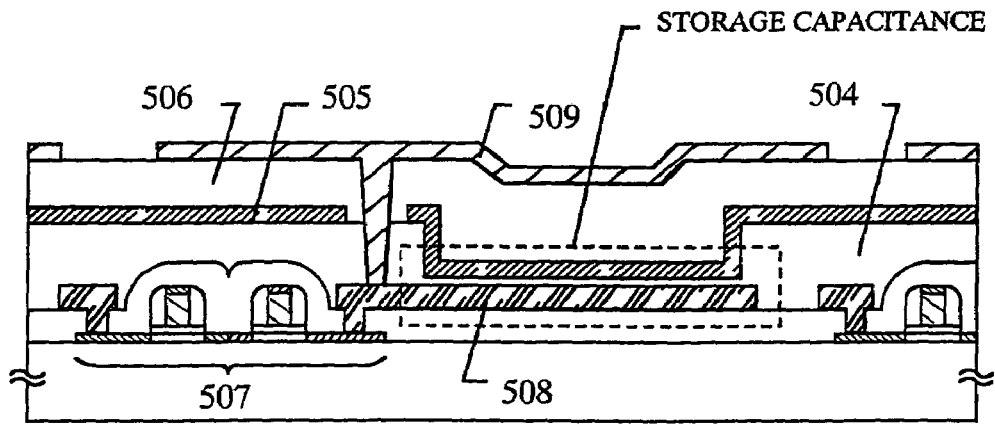

In this embodiment, an example of a reflection-type liquid crystal display device fabricated according to the present invention is shown in FIGS. 2A to 2C. Since well-known means may be used for a fabricating method of a pixel TFT (pixel switching element) and for a cell assembling step, their detailed descriptions will be omitted.

In FIG. 2A, reference numeral 11 denotes a substrate (ceramic substrate provided with a silicon oxide film) having an insulating surface, 12 denotes a pixel matrix circuit, 13 denotes a source driver circuit, 14 denotes a gate driver circuit, 15 denotes an opposite substrate, 16 denotes an FPC (Flexible Printed Circuit), and 17 denotes a signal processing circuit. As the signal processing circuit 17, a circuit for carrying out such processing that an IC has been substituted, such as a D/A converter, a γ-correction circuit, and a signal dividing circuit, can be formed. These circuits are desirably constituted with TFTs in accordance with the present invention. In an alternative, it is also possible to provide an IC chip on a glass substrate and to carry out signal processing on the IC chip.

Moreover, although the description has been made of the liquid crystal display device as an example, the present invention can also be applied to an EL (electroluminescence) display device or an EC (electrochromic) display device as long as the device is an active matrix type display device.

Here, an example of a circuit constituting the driver circuits 13 and 14 of FIG. 2A is shown in FIG. 2B. Since the TFT portion has been explained in the embodiment 1, only necessary portions will be described here.

In FIG. 2B, reference numerals 501 and 502 denote N-channel TFTs, and 503 denotes a P-channel TFT. The TFTs 501 and 503 constitute a CMOS circuit. Reference numeral 504 denotes an insulating layer made of a laminate film of a silicon nitride film/a silicon oxide film/a resin film. A titanium wiring line 505 is provided thereon, and the foregoing CMOS circuit and the TFT 502 are electrically connected. The titanium wiring line is covered with an insulating layer 506 made of a resin film. The two insulating layers 504 and 506 have also a function as a flattened film.

A part of a circuit constituting the pixel matrix circuit 12 of FIG. 2A is shown in FIG. 2C. In FIG. 2C, reference numeral 507 denotes a pixel TFT made of an N-channel TFT of double gate structure, and a drain wiring line 508 is formed so as to widely extend in a pixel region. Incidentally, other than the double gate structure, a single gate structure, a triple gate structure, or the like may be used.

An insulating layer 504 is provided thereon, and a titanium wiring line 505 is provided thereon. At this time, a recess portion is formed in a part of the insulating layer 504, and only silicon nitride and silicon oxide on the lowermost layer are made to remain. By this, an auxiliary capacitance is formed between the drain wiring line 508 and the titanium wiring line 505.

The titanium wiring line 505 provided in the pixel matrix circuit has an electric field shielding effect between source/drain wiring lines and a subsequent pixel electrode. Further, it also functions as a black mask at a gap between a plurality of pixel electrodes.

Then an insulating layer 506 is provided to cover the titanium wiring line 505, and a pixel electrode 509 made of a reflective conductive film is formed thereon. Of course, contrivance for increasing reflectivity may be made to the surface of the pixel electrode 509.

By using the present invention, it is possible to fabricate the reflection-type liquid crystal display device having the structure as described above. Of course, when a well-known technique is combined, a transmission-type liquid crystal display device can also be fabricated. Further, when a well-known technique is combined, an active matrix type EL display device can also be easily fabricated.

Although not distinguished in the drawings, it is also possible to make the film thicknesses of gate insulating films different between the pixel TFT constituting the pixel matrix circuit and the CMOS circuit constituting the driver circuit and the signal processing circuit.

In the pixel matrix circuit, since a driving voltage applied to the TFT is high, the gate insulating film with a film thickness of 50 to 200 nm is required. On the other hand, in the driver circuit and the signal processing circuit, a driving voltage applied to the TFT is low, while high speed operation is required. Thus, it is effective to make the film thickness of the gate insulating film about 3 to 30 nm, which is thinner than that of the pixel TFT.

Embodiment 4

In the liquid crystal display device fabricated in the above embodiment, other than a TN liquid crystal, various liquid crystals may be used. For example, it is possible to use a liquid crystal disclosed in "Characteristics and Driving Scheme of Polymer-Stabilized Monostable FLCD Exhibiting Fast Response Time and High Contrast Ratio with Gray-Scale Capability" by H. Furue et al. 1998 SID, "A Full-Color Thresholdless Antiferroelectric LCD Exhibiting Wide Viewing Angle with Fast Response Time" by T. Yoshida et al., 1997, SID DIGEST, 841, "Thresholdless antiferroelectricity in liquid crystals and its application to displays" by S. Inui et al., 1996, J. Mater. Chem. 6(4), 671-673, or U.S. Pat. No. 5,594,569.

A liquid crystal exhibiting antiferroelectricity in some temperature range is called an antiferroelectric liquid crystal. In mixed liquid crystals including antiferroelectric liquid crystals, there is a thresholdless antiferroelectric mixed liquid crystal exhibiting electrooptical response characteristics in which transmittance is continuously changed with respect to an electric field. Some thresholdless antiferroelectric mixed liquid crystal exhibits V-shaped electrooptical response characteristics, and the liquid crystal in which its driving voltage is about ±2.5 V (cell thickness is about 1 μm to 2 μm) has also been found.

Here, FIG. 6 shows an example of characteristics of light transmittance of the thresholdless antiferroelectric mixed liquid crystal showing the V-shaped electrooptical response to applied voltage. The vertical axis of the graph shown in FIG. 6 indicates the transmittance (in arbitrary unit) and the horizontal axis indicates the applied voltage. Incidentally, the transmission axis of a polarizing plate of a liquid crystal display device at an incident side is set almost parallel to a normal direction of a smectic layer of the thresholdless antiferroelectric mixed liquid crystal which is almost coincident with a rubbing direction of the liquid crystal display device. The transmission axis of the polarizing plate at an outgoing side is set almost normal (crossed Nicols) to the transmission axis of the polarizing plate at the incident side.

As shown in FIG. 6, it is understood that when such a thresholdless antiferroelectric mixed liquid crystal is used, low voltage driving and gradation display become possible.

In the case where such a low voltage driving thresholdless antiferroelectric mixed liquid crystal is used for a liquid crystal display device having an analog driver, it becomes possible to suppress the source voltage of a sampling circuit of an image signal to, for example, about 5 V to 8 V. Thus, the operation source voltage of the driver can be lowered, and low power consumption and high reliability of the liquid crystal display device can be realized.

Also in the case where such a low voltage driving thresholdless antiferroelectric mixed liquid crystal is used for a liquid crystal display device having a digital driver, an output voltage of a D/A conversion circuit can be lowered, so that the operation source voltage of the D/A conversion circuit can be lowered and the operation source voltage of the driver can be made low. Thus, low power consumption and high reliability of the liquid crystal display device can be realized.

Thus, to use such a low voltage driving thresholdless antiferroelectric mixed liquid crystal is also effective in the case where a TFT having an LDD region (low concentration impurity region) with a relatively small width (for example, 0 nm to 500 nm or 0 nm to 200 nm) is used.

In general, the thresholdless antiferroelectric mixed liquid crystal has large spontaneous polarization, and the dielectric constant of the liquid crystal itself is high. Thus, in the case where the thresholdless antiferroelectric mixed liquid crystal is used for a liquid crystal display device, it becomes necessary to provide relatively large holding capacitance for a pixel. Thus, it is preferable to use the thresholdless antiferroelectric mixed liquid crystal having small spontaneous polarization. Besides, it is also permissible to design such that a driving method of the liquid crystal display device is made linear sequential driving, so that a writing period (pixel feed period) of a gradation voltage to a pixel is prolonged and holding capacitance is compensated even if it is small.

Since low voltage driving can be realized by using such a thresholdless antiferroelectric mixed liquid crystal, low power consumption of the liquid crystal display device can be realized.

Incidentally, as long as a liquid crystal has electrooptical characteristics as shown in FIG. 6, any liquid crystal can be used as a display medium of a liquid crystal display device of the present invention.

Embodiment 5

The CMOS circuit or pixel matrix circuit formed by implementing the present invention can be used for a variety of electrooptical devices (such as active matrix type liquid crystal display, active matrix type EL display, and active matrix type EC display). That is, the present invention can be implemented by any electronic equipment equipped with these electrooptical devices as display media.

Such electronic equipments include a video camera, a digital camera, a (rear-type or front-type) projector, a head mount display (goggle type display), a car navigation system, a personal computer, and a portable information terminal (mobile computer, cellular phone or electronic book, etc.). FIGS. 3A to 3F and 4A to 4D depict examples of these equipments.

Figure 3A:
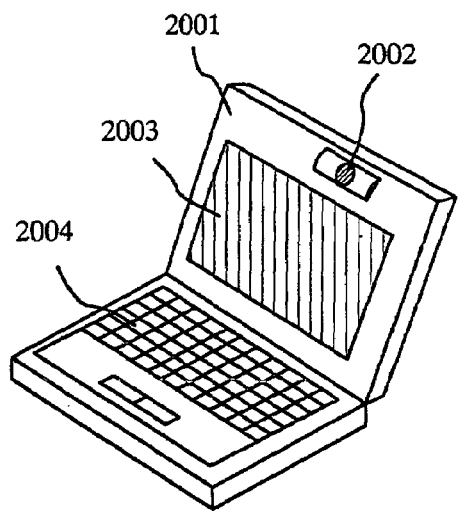
FIGS. 3A to 3F and 4A to 4D are views showing the structure of an electronic equipment.

FIG. 3A depicts a personal computer that is constituted by a main body 2001, an image input portion 2002, a display device 2003, and a keyboard 2004. The present invention can be applied to the image input portion 2002, the display device 2003, and other signal control circuits.

Figure 3B:
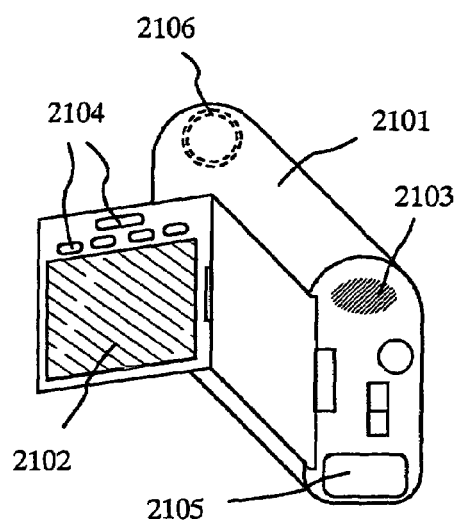

FIG. 3B depicts a video camera that is constituted by a main body 2101, a display device 2102, an audio input portion 2103, an operation switch 2104, a battery 2105, and an image receiving portion 2106. The present invention can be applied to the display device 2102, the audio input portion 2103, and other signal control circuits.

Figure 3C:
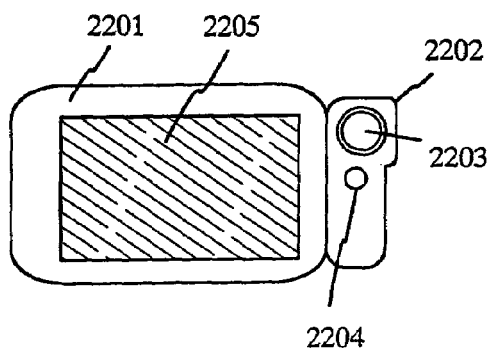

FIG. 3C depicts a mobile computer that is constituted by a main body 2201, a camera unit 2202, an image receiving portion 2203, an operation switch 2204, and a display device 2205. The present invention can be applied to the display device 2205 and other signal control circuits.

Figure 3D:
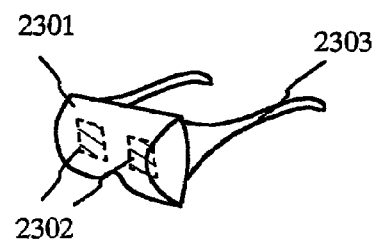

FIG. 3D depicts a goggle type display that is constituted by a main body 2301, a display device 2302, and an arm portion 2303. The present invention can be applied to the display device 2302 and other signal control circuits.

Figure 3E:
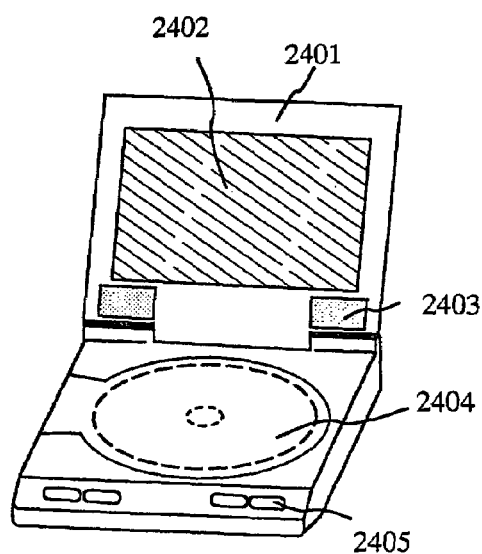

FIG. 3E depicts a player using a recording medium with a recorded program (hereinafter referred to as recording medium), that is constituted by a main body 2401, a display device 2402, a speaker unit 2403, a recording medium 2404, and an operation switch 2405. Incidentally, this apparatus uses a DVD (Digital Versatile Disc), a CD, and the like as the recording medium, and it is possible to appreciate music, to appreciate a movie, to play a game, and to perform the Internet. The present invention can be applied to the display device 2402 and other signal control circuits.

Figure 3F:
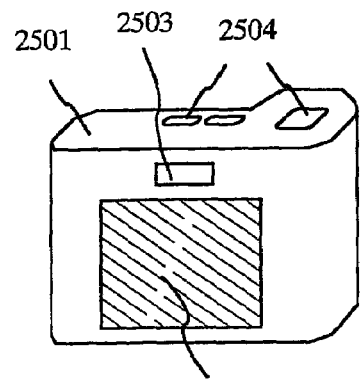

FIG. 3F depicts a digital camera that is constituted by a main body 2501, a display device 2502, an eyepiece portion 2503, an operation switch 2504, and an image receiving portion (not shown). The present invention can be applied to the display device 2502 and other signal control circuits.

Figure 4A:
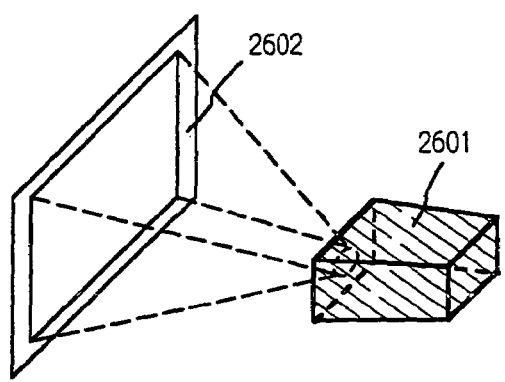

FIG. 4A depicts a front type projector that is constituted by a display device 2601, and a screen 2602. The present invention can be applied to the display device 2601 and other signal control circuits.

Figure 4B:
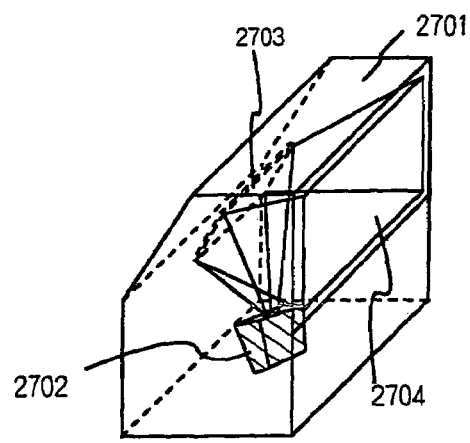

FIG. 4B depicts a rear type projector that is constituted by a main body 2701, a display device 2702, a mirror 2703, and a screen 2704 The present invention can be applied to the display device 2702 and other signal control circuits.

Figure 4C:
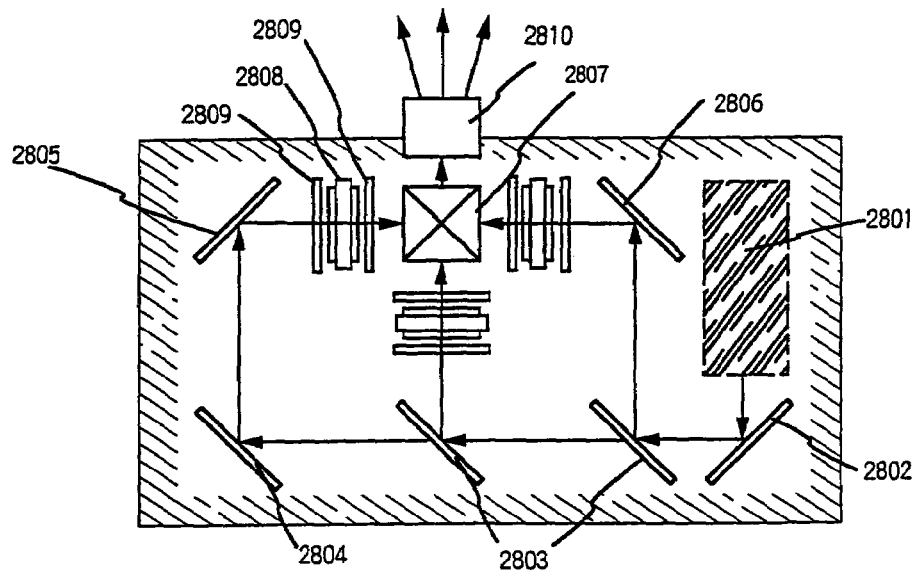

FIG. 4C shows an example of the structure of the display devices 2601, 2702 shown in FIGS. 4A and 4B. The display devices 2601, 2702 each are constituted by a light source optical system 2801, mirrors 2802, 2804 to 2806, a dichroic mirror 2803, a prism 2807, a liquid crystal display device 2808, a phase plate 2809, and a projection optical system 2810. The projection optical system 2810 is constituted by an optical system including a projection lens. Although this embodiment shows an example of a three-plate type, it is not limited thereto, and a single plate type may also be available, for instance. Further, optionally, an optical system such as an optical lens, a film with a polarization function, a film controlling the phase difference, and an IR film may be disposed at the light path indicated by an arrow in FIG. 4C.

Figure 4D:
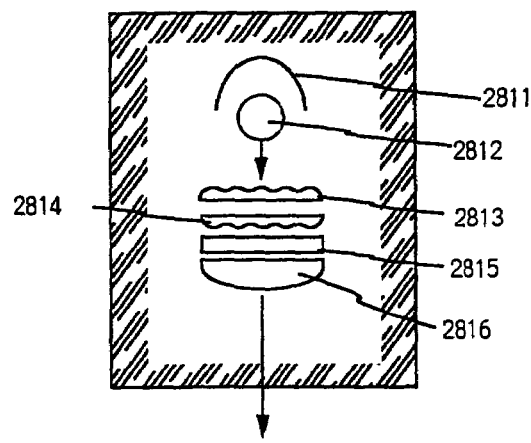

FIG. 4D shows an example of the structure of the light source optical system 2801 of FIG. 4C. In this embodiment, the light source optical system 2801 is constituted by a reflector 2811, light sources 2812, 2813, 2814, a polarization conversion component 2815, and a condenser 2816. Incidentally, the light source optical system shown in FIG. 4D is merely an example but is not limited thereto. For example, optionally, an optical system such as such as an optical lens, a film with a polarization function, a film controlling the phase difference, and an IR film may be disposed.

As set forth above, the scope of application of the present invention is extremely wide and the present invention can be applied to electronic equipments of any field. Moreover, the electronic equipments of this embodiment can be realized even if a structure of any combination of the embodiments 1 to 5 is used.

What is claimed is:

1. A method of manufacturing a semiconductor device comprising the steps of:
    forming a semiconductor film comprising silicon over a substrate;
    irradiating said semiconductor film with laser light in air for crystallizing said semiconductor film;
    removing an oxide film formed on a surface of the crystallized semiconductor film by etching after the irradiation of the laser light;
    recrystallizing the recrystallized semiconductor film in a reducing atmosphere after removing said oxide film;
    forming a gate insulating film over the crystallized semiconductor film after the recrystallizing step; and
    forming an impurity region in the recrystallized semiconductor film after forming the gate insulating film.

2. A method of manufacturing a semiconductor device comprising the steps of:
    forming a semiconductor film comprising silicon over a substrate;
    irradiating said semiconductor film with laser light in air for crystallizing said semiconductor film;
    removing an oxide film formed on a surface of the crystallized semiconductor film by etching after the irradiation of the laser light;
    recrystallizing the crystallized semiconductor film in an inert gas after removing said oxide film;
    forming a gate insulating film over the recrystallized semiconductor film after the recrystallizing step; and
    forming an impurity region in the recrystallized semiconductor film after forming the gate insulating film.

3. A method of manufacturing a semiconductor device comprising the steps of:
    forming a semiconductor film comprising silicon over a substrate;
    irradiating said semiconductor film with laser light in air for crystallizing said semiconductor film;
    removing an oxide film formed on a surface of the crystallized semiconductor film by etching after the irradiation of the laser light;
    recrystallizing the crystallized semiconductor film in an atmosphere after removing said oxide film;
    forming a gate insulating film over the recrystallized semiconductor film after the recrystallizing step; and
    forming an impurity region in the recrystallized semiconductor film after forming the gate insulating film,
    wherein a concentration of oxygen or an oxygen compound contained in said atmosphere is 10 ppm or less.

4. A method of manufacturing a semiconductor device comprising the steps of:
forming a semiconductor film comprising silicon over a substrate;
irradiating said semiconductor film with laser light in air for crystallizing said semiconductor film;
removing an oxide film formed on a surface of the crystallized semiconductor film by etching after the irradiation of the laser light;
recrystallizing the crystallized semiconductor film in a reducing atmosphere after removing said oxide film;
forming a gate insulating film over the recrystallized semiconductor film after the recrystallizing step; and
forming an impurity region in the recrystallized semiconductor film after forming the gate insulating film,
wherein a concentration of oxygen or an oxygen compound contained in said reducing atmosphere is 10 ppm or less.

5. A method of manufacturing a semiconductor device comprising the steps of:
forming a semiconductor film comprising silicon over a substrate;
irradiating said semiconductor film with laser light in air for crystallizing said semiconductor film;
removing an oxide film formed on a surface of the crystallized semiconductor film by etching after the irradiation of the laser light;
recrystallizing the crystallized semiconductor film in an inert gas after removing said oxide film;
forming a gate insulating film over the recrystallized semiconductor film after the recrystallizing step; and
forming an impurity region in the recrystallized semiconductor film after forming the gate insulating film,
wherein a concentration of oxygen or an oxygen compound contained in said inert gas is 10 ppm or less.

6. A method of manufacturing a semiconductor device comprising the steps of:
forming a semiconductor film comprising silicon over a substrate;
irradiating said semiconductor film with laser light in air for crystallizing said semiconductor film;
treating a surface of the semiconductor film with a hydrofluoric acid to remove a natural oxidation film formed on the surface of the crystallized semiconductor film after the irradiation of the laser light;
recrystallizing the crystallized semiconductor film after the treatment with said hydrofluoric acid;
forming a gate insulating film over the recrystallized semiconductor film after the recrystallizing step; and
forming an impurity region in the recrystallized semiconductor film after forming the gate insulating film.

7. A method of manufacturing a semiconductor device comprising the steps of:
forming a semiconductor film comprising silicon over a substrate;
irradiating said semiconductor film with laser light in air for crystallizing said semiconductor film;
treating a surface of the crystallized semiconductor film with a hydrofluoric acid after the irradiation of the laser light;
recrystallizing the crystallized semiconductor film after the treatment with said hydrofluoric acid in a reducing atmosphere;
forming a gate insulating film over the recrystallized semiconductor film after the recrystallizing step; and
forming an impurity region in the recrystallized semiconductor film after forming the gate insulating film.

8. A method of manufacturing a semiconductor device comprising the steps of:
forming a semiconductor film comprising silicon over a substrate;
irradiating said semiconductor film with laser light in air for crystallizing said semiconductor film;
treating a surface of the crystallized semiconductor film with a hydrofluoric acid after the irradiation of the laser light;
recrystallizing the crystallized semiconductor film after the treatment with said hydrofluoric acid in an inert gas;
forming a gate insulating film over the recrystallized semiconductor film after the recrystallizing step; and
forming an impurity region in the recrystallized semiconductor film after forming the gate insulating film.

9. A method of manufacturing a semiconductor device comprising the steps of:
forming a semiconductor film comprising silicon over a substrate;
irradiating said semiconductor film with laser light in air for crystallizing said semiconductor film;
treating a surface of the crystallized semiconductor film with a hydrofluoric acid after the irradiation of the laser light;
recrystallizing the crystallized semiconductor film after the treatment with said hydrofluoric acid in an atmosphere;
forming a gate insulating film over the recrystallized semiconductor film after the recrystallizing step; and
forming an impurity region in the recrystallized semiconductor film after forming the gate insulating film,
wherein a concentration of oxygen or an oxygen compound contained in said atmosphere is 10 ppm or less.

10. A method of manufacturing a semiconductor device comprising the steps of:
forming a semiconductor film comprising silicon over a substrate;
irradiating said semiconductor film with laser light in air for crystallizing said semiconductor film;
treating a surface of the crystallized semiconductor film with a hydrofluoric acid after the irradiation of the laser light;
recrystallizing the crystallized semiconductor film after the treatment with said hydrofluoric acid in a reducing atmosphere;
forming a gate insulating film over the recrystallized semiconductor film after the recrystallizing step; and
forming an impurity region in the recrystallized semiconductor film after forming the gate insulating film,
wherein a concentration of oxygen or an oxygen compound contained in said reducing atmosphere is 10 ppm or less.

11. A method of manufacturing a semiconductor device comprising the steps of:
forming a semiconductor film comprising silicon over a substrate;
irradiating said semiconductor film with laser light in air for crystallizing said semiconductor film;
treating a surface of the crystallized semiconductor film with a hydrofluoric acid after the irradiation of the laser light;
recrystallizing the crystallized semiconductor film after the treatment with said hydrofluoric acid in an inert gas;
forming a gate insulating film over the recrystallized semiconductor film after the recrystallizing step; and
forming an impurity region in the recrystallized semiconductor film after forming the gate insulating film, wherein a concentration of oxygen or an oxygen compound contained in said inert gas is 10 ppm or less.

12. A method of manufacturing a semiconductor device according to any one of claims 1-11, wherein the step of recrystallizing said crystallized semiconductor film is conducted by furnace annealing.

13. A method of manufacturing a semiconductor device according to any one of claims 1-11, wherein the step of recrystallizing said crystallized semiconductor film is conducted between 900 and 1200° C.

14. A method of manufacturing a semiconductor device according to any one of claims 2, 5, 8, and 11, wherein said inert gas is nitrogen.

15. A method of manufacturing a semiconductor device according to any one of claims 1, 4, 7, and 10, wherein said reducing atmosphere comprises hydrogen.

16. A method of manufacturing a semiconductor device according to any one of claims 1-11, further comprising a step of treating a surface of the semiconductor film with a buffered hydrofluoric acid before the irradiation of the laser light.

17. A method of manufacturing a semiconductor device comprising the steps of:
    forming a semiconductor film comprising silicon over a substrate;
    irradiating said semiconductor film with laser light in an atmosphere containing oxygen for crystallizing said semiconductor film;
    removing an oxide film formed on a surface of the crystallized semiconductor film by etching after the irradiation of the laser light;
    recrystallizing the crystallized semiconductor film in an atmosphere after removing said oxide film;
    forming a gate insulating film over the recrystallized semiconductor film after the recrystallizing step; and
    forming an impurity region in the recrystallized semiconductor film after forming the gate insulating film,
    wherein a concentration of oxygen or an oxygen compound contained in said atmosphere is 10 ppm or less.

18. A method of manufacturing a semiconductor device comprising the steps of:
    forming a semiconductor film comprising silicon over a substrate;
    irradiating said semiconductor film with laser light in an atmosphere containing oxygen for crystallizing said semiconductor film;
    treating a surface of the crystallized semiconductor film with a hydrofluoric acid after the irradiation of the laser light;
    recrystallizing the crystallized semiconductor film after the treatment with said hydrofluoric acid in an atmosphere;
    forming a gate insulating film over the recrystallized semiconductor film after the recrystallizing step; and
    forming an impurity region in the recrystallized semiconductor film after forming the gate insulating film,
    wherein a concentration of oxygen or an oxygen compound contained in said atmosphere is 10 ppm or less.

19. A method of manufacturing a semiconductor device according to claim 17, wherein the step of recrystallizing said crystallized semiconductor film is conducted by furnace annealing.

20. A method of manufacturing a semiconductor device according to claim 18, wherein the step of recrystallizing said crystallized semiconductor film is conducted by furnace annealing.

21. A method of manufacturing a semiconductor device according to claim 17, wherein the step of recrystallizing said crystallized semiconductor film is conducted between 900 and 1200° C.

22. A method of manufacturing a semiconductor device according to claim 18, wherein the step of recrystallizing said crystallized semiconductor film is conducted between 900 and 1200° C.

23. A method of manufacturing a semiconductor device according to claim 17, wherein said atmosphere in said recrystallizing step contains an inert gas.

24. A method of manufacturing a semiconductor device according to claim 18, wherein said atmosphere in said recrystallizing step contains an inert gas.

25. A method of manufacturing a semiconductor device according to claim 17, wherein said atmosphere in said recrystallizing step contains a reducing atmosphere.

26. A method of manufacturing a semiconductor device according to claim 18, wherein said atmosphere in said recrystallizing step contains a reducing atmosphere.

27. A method of manufacturing a semiconductor device according to claim 17, further comprising a step of treating a surface of the semiconductor film with a buffered hydrofluoric acid before the irradiation of the laser light.

28. A method of manufacturing a semiconductor device according to claim 18, further comprising a step of treating a surface of the semiconductor film with a buffered hydrofluoric acid before the irradiation of the laser light.

29. A method of manufacturing a semiconductor device comprising the steps of:
    forming a semiconductor film comprising silicon over a substrate;
    irradiating said semiconductor film with laser light in an atmosphere containing oxygen for crystallizing said semiconductor film;
    removing a natural oxidation film formed on a surface of the crystallized semiconductor film by etching after the irradiation of the laser light;
    recrystallizing the crystallized semiconductor film after removing said natural oxidation film;
    forming a gate insulating film over the recrystallized semiconductor film after the recrystallizing step; and
    forming an impurity region in the recrystallized semiconductor film after forming the gate insulating film.

30. A method of manufacturing a semiconductor device comprising the steps of:
    forming a semiconductor film comprising silicon over a substrate;
    irradiating said semiconductor film with laser light in an atmosphere containing oxygen for crystallizing said semiconductor film;
    treating a surface of the crystallized semiconductor film with a hydrofluoric acid to remove a natural oxidation film formed on the surface of the crystallized semiconductor film after the irradiation of the laser light;
    recrystallizing the crystallized semiconductor film after the treatment with said hydrofluoric acid;
    forming a gate insulating film over the recrystallized semiconductor film after the recrystallizing step; and
    forming an impurity region in the recrystallized semiconductor film after forming the gate insulating film.

31. A method of manufacturing a semiconductor device according to claim 29, wherein the step of recrystallizing said crystallized semiconductor film is conducted by furnace annealing.

32. A method of manufacturing a semiconductor device according to claim 30, wherein the step of recrystallizing said crystallized semiconductor film is conducted by furnace annealing.

33. A method of manufacturing a semiconductor device according to claim 29, wherein the step of recrystallizing said crystallized semiconductor film is conducted between 900 and 1200° C.

34. A method of manufacturing a semiconductor device according to claim 30, wherein the step of recrystallizing said crystallized semiconductor film is conducted between 900 and 1200° C.

35. A method of manufacturing a semiconductor device according to claim 29, wherein an atmosphere in said recrystallizing step contains an inert gas.

36. A method of manufacturing a semiconductor device according to claim 30, wherein an atmosphere in said recrystallizing step contains an inert gas.

37. A method of manufacturing a semiconductor device according to claim 29, wherein an atmosphere in said recrystallizing step contains a reducing atmosphere.

38. A method of manufacturing a semiconductor device according to claim 30, wherein an atmosphere in said recrystallizing step contains a reducing atmosphere.

39. A method of manufacturing a semiconductor device according to claim 29, further comprising a step of treating a surface of the semiconductor film with a buffered hydrofluoric acid before the irradiation of the laser light.

40. A method of manufacturing a semiconductor device according to claim 30, further comprising a step of treating a surface of the semiconductor film with a buffered hydrofluoric acid before the irradiation of the laser light.

41. A method of manufacturing a semiconductor device comprising the steps of:

forming a semiconductor film comprising silicon over a substrate;

irradiating the semiconductor film with laser light in air for crystallizing the semiconductor film;

removing a natural oxidation film formed on a surface of the crystallized semiconductor film by etching after the irradiation of the laser light;

recrystallizing the crystallized semiconductor film after removing said natural oxidation film;

forming a gate insulating film over the recrystallized semiconductor film after the recrystallizing step; and forming an impurity region in the recrystallized semiconductor film after forming the gate insulating film.

42. A method of manufacturing a semiconductor device according to claim 41, wherein the step of recrystallizing the crystallized semiconductor film is conducted by furnace annealing.

43. A method of manufacturing a semiconductor device according to claim 41, wherein the step of recrystallizing said crystallized semiconductor film is conducted between 900 and 1200° C.

44. A method of manufacturing a semiconductor device according to claim 41, wherein an atmosphere in the recrystallizing step contains an inert gas.

45. A method of manufacturing a semiconductor device according to claim 41, wherein an atmosphere in the recrystallizing step contains a reducing atmosphere.

46. A method of manufacturing a semiconductor device according to claim 41, further comprising a step of treating a surface of the semiconductor film with a buffered hydrofluoric acid before the irradiation of the laser light.

* * * * *